United States Patent
Zheng et al.

(10) Patent No.: US 11,923,663 B2
(45) Date of Patent: Mar. 5, 2024

(54) SPARK PLUG HEAT RATING MEASUREMENT METHOD AND SYSTEM BASED ON SPARK DISCHARGE CURRENT ACTIVE HEATING

(71) Applicant: WEICHAI TORCH TECHNOLOGY CO., LTD., Hunan (CN)

(72) Inventors: Ming Zheng, Ontario (CA); Guangyun Chen, Hunan (CN); Xiao Yu, Ontario (CA); Tangliang Zhang, Hunan (CN); Jin Qian, Hunan (CN); Hua Zhu, Ontario (CA)

(73) Assignee: WEICHAI TORCH TECHNOLOGY CO., LTD., Hunan (CN)

( * ) Notice: Subject to any disclaimer, the term of this patent is extended or adjusted under 35 U.S.C. 154(b) by 355 days.

(21) Appl. No.: 17/382,376

(22) Filed: Jul. 22, 2021

(65) Prior Publication Data

US 2021/0351574 A1    Nov. 11, 2021

Related U.S. Application Data

(63) Continuation-in-part of application No. PCT/CN2019/123701, filed on Dec. 6, 2019.

(51) Int. Cl.
    *H01T 13/60* (2011.01)
    *G01R 31/14* (2006.01)
    *H01T 13/38* (2006.01)

(52) U.S. Cl.
    CPC .......... *H01T 13/60* (2013.01); *G01R 31/14* (2013.01); *H01T 13/38* (2013.01)

(58) Field of Classification Search
    CPC ......... H01T 13/60; H01T 13/38; H01T 13/16; H01T 13/58; G01R 31/14
    See application file for complete search history.

(56) References Cited

U.S. PATENT DOCUMENTS

| 5,521,509 A | * | 5/1996 | Ishikawa | ................ | F02P 17/04 |
| | | | | | 324/393 |
| 2003/0006775 A1 | * | 1/2003 | Wright | .................... | F02P 17/00 |
| | | | | | 324/399 |

(Continued)

FOREIGN PATENT DOCUMENTS

| CN | 101843168 | 9/2010 |
| CN | 102686948 | 9/2012 |

(Continued)

OTHER PUBLICATIONS

"International Search Report (Form PCT/ISA/210) of PCT/CN2019/123701", dated Jun. 11, 2020, , pp. 1-4.

(Continued)

*Primary Examiner* — Akm Zakaria
(74) *Attorney, Agent, or Firm* — JCIP GLOBAL INC.

(57) ABSTRACT

In the spark plug heat rating measurement method and system based on spark discharge current active heating, the spark plug is installed in a constant-temperature water jacket cooling chamber with a specific torque. A constant spark discharge current control module is connected to the high-voltage terminal of the spark plug, to provide real-time controlled discharge current to heat up the high-voltage central electrode of the spark plug. During the spark discharge process, the temperature change of the high-voltage central electrode and the surrounding ceramic insulator are measured by a temperature detection module and used to determine the heat rating of the spark plug. By real time adjusting the discharge current level of the spark plug, or providing a same amount of spark energy to the spark gap, the heat ratings of spark plugs with different ceramic insulation structures can be evaluated through the temperature changes during discharge or after discharge.

7 Claims, 4 Drawing Sheets

(56) References Cited

U.S. PATENT DOCUMENTS

| | | | | |
|---|---|---|---|---|
| 2011/0239998 A1* | 10/2011 | Aida | ................... | F02P 3/0876 |
| | | | | 123/620 |
| 2019/0165548 A1* | 5/2019 | Kato | ..................... | H01T 13/20 |
| 2019/0372313 A1* | 12/2019 | Karumi | ................. | H01T 13/58 |

FOREIGN PATENT DOCUMENTS

| | | |
|---|---|---|
| CN | 108512036 | 9/2018 |
| JP | H06299943 | 10/1994 |
| JP | 2010049856 | 3/2010 |
| WO | 2015090733 | 6/2015 |

OTHER PUBLICATIONS

"Written Opinion of the International Searching Authourity (Form/ISA/237) of PCT/CN2019/123701", dated Jun. 11, 2020, pp. 1-9.

* cited by examiner

SPARK PLUG HEAT RATING MEASUREMENT METHOD AND SYSTEM BASED ON SPARK DISCHARGE CURRENT ACTIVE HEATING

CROSS-REFERENCE TO RELATED APPLICATION

This application is a continuation in part of international PCT application serial no. PCT/CN2019/123701, filed on Dec. 6, 2019. The entirety of the above-mentioned patent application is hereby incorporated by reference herein and made a part of this specification.

BACKGROUND

Technical Field

The present invention generally relates to a measurement method and a measurement system to measure the performance of a spark plug, and more particularly to measure the heat rating of the spark plug with spark discharge current active heat. With the same amount of spark gap energy supplied to the spark plug, this spark plug heat rating measurement method and system based on spark discharge current active heating can measure the temperature changes of the high-voltage central electrodes and the surrounding ceramic insulators of spark plugs with different heat ratings, to evaluate the heat rating ranges of the spark plugs. The present invention relates to the technical field of spark plug control.

Description of Related Art

A spark plug is one of the most important parts for a spark ignition engine. It mainly consists of a high-voltage central electrode, a ceramic insulator, and a metal shell. The high-voltage central electrode and the ground electrode of the metal shell forms a spark gap. Driven by the ignition coil, a spark is generated within the spark gap to ignite the in-cylinder combustible gas mixture. During the engine operating, in addition to the combustion heat being converted into useful work and exhaust waste heat, about one-third of the combustion heat is absorbed by the cylinder wall. A water jacket is thus arranged in the engine block to timely dissipate the accumulated heat out and ensure the temperature of the cylinder wall is constant. The spark plug is often installed at the top of the combustion chamber. The high-voltage central electrode of the spark plug is insulated from the cylinder wall. Because of the resistive heat caused by the discharge current, and the high temperature inside the combustion chamber during the combustion process, the temperature of the high-voltage central electrode is much higher than the temperature of the cylinder wall. The accumulated heat on the high-voltage central electrode can only be transferred to the metal shell of the spark plug through the surrounding ceramic insulator.

During the SI engine operations, the temperature of the high-voltage central electrode and the surrounding ceramic insulator of the spark plug should be controlled within an appropriate range. The heat rating of a spark plug is an industry standard to evaluate the heat dissipation capability of a spark plug. A spark plug with a high heat rating will have a high temperature central electrode, which will lead to pre-ignition, while a spark plug with a low heat rating will have a low temperature central electrode, which will lead to soot and carbon deposition on the spark plug. This will deteriorate the ignition capability of the spark plug, or even result in the complete failure of the spark plug. Therefore, matching the heat rating of the spark plug with the engine operating conditions is of particular importance for reliable engine operations.

Based on present patent retrieval, no identical patent publication is found compared with the present invention. Some of the patent remotely related to the present patent is listed below:

1. Reference patent CN200880113816.8 disclosed a type of ceramic heater and a spark plug containing the ceramic heater. The ceramic heater contains opposing portions disposed side by side, a pair of lead wires connected to the ends of the heating resistors, and a ceramic base in which the heating resistors and the lead wires are embedded, wherein a part that has a thermal conductivity higher than that of the ceramic base is arranged between the opposing portions in the ceramic base. However, the heating effect of the proposed solution is not sufficient to heat up the electrode of the spark plug quickly, because cold start process demands fast heating up the electrode of the spark plug, especially when the ambient temperature is cold. In addition, the heat transfer of the ceramic resistor is comparatively slow, so the spark plug cannot be heated to a high temperature. Furthermore, this patent only simply mentions the heating of the spark plug, but does not include anything related to the soot and carbon depositions caused by the low temperature of the high-voltage central electrode of the spark plug after the engine start-up.

2. Reference patent CN 201180005764.4, named as "Heater Plug Having A Metal Finger", was filed by Continental Automotive France and Continental Automotive GmbH. This patent disclosed a type of heater plug. The patented plug contains a tubular body, a finger mounted inside the tubular body protruding outside the body at one extremity of this body, and a pressure sensor. A membrane extending between the tubular body and the finger enables a relative longitudinal movement between the finger and the body. The metal tubular body is used to heat the plug based on the pressure signals provided by the pressure sensor. This heater plug has little impact on the emission reduction of diesel engines, since the engine start-up is more affected by the intake pressure, while less impacted by the intake temperature.

3. Reference patent CN 201710112897.0, named as "Engine ignition spark plug, the ignition method and measurement system", was filed by Hitachi Automotive China Corporation. The patent disclosed a type of spark plug for gasoline engines, which includes a central electrode and a ground electrode. The central electrode contains a terminal nut, a ceramic insulator surrounding the terminal nut, and a central conductor that is connected to the terminal nut. The grounding part consists of a metal shell and a ground electrode at the end of the metal shell. The ground electrode and the central electrode are arranged opposite to each other to form an air gap. An electromagnetic inductive heating coil, which is placed in between the central electrode and the ground electrode, is used to heat the spark plug. The patent also provides an ignition method for the spark plug, including heating the spark plug before ignition. The patent requires modifications in the structure of the spark plug. In addition, heating the spark plug through the electromagnetic heating coil makes the structure of the ignition system more complicated, and also adds difficulties to precisely control the ignition environment of the spark plug.

4. Reference patent US90055301, named as "System for measuring spark plug suppressor resistance under simulated operating conditions", was filed by Delphi US. The patent disclosed a method to measure the internal resistance of a spark plug under heated conditions, wherein a high voltage power supply was used to heat the internal resistor of the spark plug. Since the internal resistor of a spark plug significantly affects the spark gap energy, this internal resistance measurement system can reduce the error in the spark gap energy calibration process that is caused by the resistance changes with the temperature of the spark plug. Because the purpose of the patent is to measure the internal resistance of the spark plug instead of the heat rating, the patent does not consider the heating process of the central electrode by the plasma channel, and also the heat dissipation of the spark plug metal shell. The heat rating of the spark plug represents the capability of the spark plug to transfer the accumulated heat from the central electrode to the engine cylinder wall. The heat transfer path of a spark plug with an inside heat source is different from the spark plug without it, therefore, the patent cannot measure the heat rating of the spark plug. In addition, the spark plasma discharge is a transient process, which requires a fast, real-time close-loop control. Therefore, the way to adjust the discharge current level through a high voltage power supply in the patent is different from the claims in the present invention.

Technical Problems

The current spark plug heat rating measurement method in China mainly refers to "GB/T 38184-2019 Road vehicles-spark plug heat rating classification and test method". In this standard, the heat rating of the spark plug is measured in a SAE 17.6 in$^3$ spark plug heat-rating engine or an equivalent engine. This test method strictly defines the operational parameters of the engine, including the engine speed, the composition and injection pressure of the fuel, the gas mixture ratio, the pressures and temperatures of the coolant water, oil, and intake air, as well as the torque of installing the spark plug. The heat rating is the indicated mean effective pressure (IMEP) value obtained when the engine is operated under the maximum engine load without preignition. This test method requires the precise controls of the engine operation parameters to get the reliable results. Similar international standards also require special engine test systems to evaluate the heat rating of the spark plug, thus, the test process is complicated, with the needs to control various engine operating parameters. In this regard, a fast but accurate method to determine the heat rating of the spark plug becomes an important part during the spark plug development process.

The heat rating of a spark plug mainly represents the heat transfer capability of the high-voltage electrode and the metal shell of the spark plug, which is mostly determined by the structure of the ceramic insulator. Therefore, it is feasible to evaluate the heat rating of a spark plug via the temperature changes of the high-voltage electrode and the surrounding ceramic insulator during the discharge process of the spark plug, providing the high-voltage electrode can be heated inside the spark plug, and the temperature of the metal shell and the spark gap energy can be controlled precisely. Since such kind of a method does not need a specific engine, the measurement system is greatly simplified, with less parameters to be precisely controlled, and shorter test durations, thus, lower measurement costs and higher efficiency.

Currently, there is no specific patent to measure the heat rating of the spark plug. For the patents mentioned above, although they are related to spark plug, and include the heating process of the spark plug, with some technical solutions to improve the current ignition system, those patents do not involve how to determine the heat rating of a spark plug. Therefore, currently the heat rating measurement of the spark plug in China is still according to the GB standard "GB/T 38184-2019 Road vehicles-spark plug heat rating classification and test method", or uses an equivalent spark plug heat rating engine to evaluate the heat rating of a spark plug. So it is necessary to develop and improve the measurement method for the heat rating of spark plug, to reduce test cost and improve efficiency.

SUMMARY

The present invention aims to provide a new measurement method and system to measure the heat rating of spark plug, addressing the problems that the existing spark plug heat rating measurement method is facing, which includes the complicated test process, the reliance on engine tests, and also the needs to precisely control various engine operating parameters to get reliable test results. The measurement method disclosed in the present invention does not rely on any engine tests, thus, simplifies the measurement system, with less test parameters to be precisely controlled and shorter experimental durations, thereby, requires lower test costs and has higher efficiency.

In order to fulfill this purpose, the present invention provides a spark plug heat rating measurement system and method based on spark discharge current active heating, which uses the spark plasma channel to heat up the high-voltage electrode of a spark plug, and measures the temperature changes of the high-voltage electrode and the surrounding ceramic insulator to determine the heat rating of the spark plug. In the claimed method, the spark discharge current amplitude is precisely controlled for controlling the temperature of the plasma channel, to heat up the high-voltage electrode of the spark plug. With the same amount of spark gap energy supplied to the spark gap, the heat rating of the spark plug is determined by the temperature changes of the high-voltage electrode and the surrounding ceramic insulator measured during the spark discharge process.

Moreover, the claimed method to precisely control the spark discharge current is to install the spark plug in a constant-temperature water jacket cooling chamber (0° C. or 80° C.) with a specific torque, and connect the high-voltage terminal of the spark plug to a constant spark discharge current control module. In this process, the constant spark discharge current control module provides a constant controllable discharge current to the spark plug, thereby, to heat up the high-voltage electrode of the spark plug with the high temperature spark plasma channel. During the spark discharge process, based on the discharge current level feedback from a DC (direct current) sensor, and the temperatures of the high-voltage central electrode and the surrounding ceramic insulator measured by a temperature module, the constant spark discharge current control module dynamically adjusts the discharge current level with real-time control, thereby to control the temperature of the plasma channel, and provide the necessary spark gap energy to heat up the high-voltage central electrode of the spark plug.

Moreover, the claimed method to measure the temperature changes of the high-voltage central electrodes and the surrounding ceramic insulators of different spark plugs under the same spark gap energy level is to put the spark plugs with different heat ratings into a temperature detection module, and evaluate the heat ratings by the temperature changes of the spark plugs under the same spark gap energy condition, thereby to obtain the heat dissipation characteristics of the ceramic insulators of the spark plugs.

Moreover, the claimed method of evaluating the heat ratings of the spark plugs through the temperature changes of the ceramic insulators of spark plugs with different heat ratings under the same spark gap energy condition is to heat up the high-voltage central electrodes and the surrounding ceramic insulators of different spark plugs by providing the same amount of spark gap energy through the real time control of the spark discharge current amplitude. The spark gap energy is accurately controlled by precisely adjusting the spark discharge duration from 10 s to 120 s and the spark discharge current amplitude from 40 mA to 200 mA. With the same amount of spark gap energy, the heat ratings of different spark plugs can be compared through the temperature changes of the high-voltage central electrodes and the surrounding ceramic insulators.

Moreover, the claimed method of evaluating the heat ratings of the spark plugs through the temperature changes of the ceramic insulators of spark plugs with different heat ratings under the same spark gap energy condition is to control the temperatures of the spark plasma channels by the real time control of the spark discharge current amplitude. The spark plasma channels are used to heat up the high-voltage central electrodes of spark plugs with different heat ratings. In the meantime, the discharge voltages at the spark plug terminals and the spark discharge current are measured to calculate the heating powers of the spark plugs. With the real time control of the spark discharge current through the constant spark discharge current control module, different spark plugs can have the same instantaneous heating power during the heating process. With different heating durations, the high-voltage central electrodes and the surrounding ceramic insulators of different spark plugs can reach the same temperature. Thereby, the heat ratings of different spark plugs can be determined by the temperature rising curves of the high-voltage central electrodes and the surrounding ceramic insulators during the heating process.

Moreover, the claimed method of evaluating heat ratings of the spark plugs through the temperature changes of the ceramic insulators of spark plugs with different heat ratings under the same spark gap energy condition is to dynamically adjust the spark discharge current to generate the plasma channels with different temperatures. With different heating durations, the high-voltage central electrodes and the surrounding ceramic insulators of different spark plugs can reach the same temperature. Once the temperatures of the high-voltage central electrodes and the surrounding ceramic insulators of different spark plugs reach the same temperature, the heating process is cut off, letting the spark plugs be cooled down naturally. During the spark plug cooling processes, the temperature profiles of the high-voltage central electrodes and the surrounding ceramic insulators are recorded. Since the heat rating of the spark plug reflects the heat dissipation capability of the high-voltage central electrode and the surrounding ceramic insulator, the spark plugs with different heat ratings will have different temperature curves during the cooling process. Therefore, the temperature curves of the cooling process can be used to evaluate and compare the heat ratings of different spark plugs.

The spark plug heat rating measurement system based on spark discharge current active heating includes a constant spark discharge current control module, a real-time controller, a spark discharge current measurement module, a temperature detection module, and the tested spark plug. The constant spark discharge current control module is connected to the high-voltage terminal of the spark plug. The constant spark discharge current control module provides controllable spark discharge current to heat up the high-voltage central electrode of the tested spark plug; the spark discharge current measurement module is connected to both the tested spark plug and the real-time controller, to instantaneously measure the spark discharge current amplitude and feedback to the real-time controller; the temperature detection module is also connected to both the tested spark plug and the real-time controller. The temperature detection module is used to monitor the temperatures of the high-voltage central electrode and the surrounding ceramic insulator of the spark plug, and feedback the temperature signals to the real-time controller. The real-time controller is used to dynamically monitor and control the output discharge current level of the constant spark discharge current control module.

Moreover, the claimed temperature detection module includes a temperature measurement module for the high-voltage central electrode and the surrounding ceramic insulator of the spark plug, and a thermocouple temperature measurement system for the constant-temperature water jacket cooling chamber. The temperature measurement module for the high-voltage central electrode and the surrounding ceramic insulator is mainly used to measure the temperature changes of the high-voltage central electrode and the surrounding ceramic insulator of the tested spark plug during the discharge process, and provide the measurement results to the real-time controller. The temperature profiles of the high-voltage central electrode and the surrounding ceramic insulator measured during the discharge process are used as the parameters to evaluate the heat rating of the tested spark plug. The tested spark plug is installed in the constant-temperature water jacket cooling chamber. The thermocouple temperature measurement system is used to measure the temperature of the constant-temperature water jacket cooling chamber, and feedback the temperature to the real-time controller. The real-time controller controls a cooler, to ensure the temperature of the constant-temperature water jacket cooling chamber is within 0-80° C.

Moreover, the claimed spark discharge current measurement module is a DC sensor. The DC sensor is used to measure the spark discharge current amplitude. The temperature measurement module for the high-voltage central electrode and the surrounding ceramic insulator includes an infrared temperature measurement system, a thermocouple measurement system, and a laser-induced fluorescence detection system.

Benefits

The present invention uses the temperature profiles of different spark plugs under the same spark gap energy conditions to evaluate the heat ratings of the spark plugs, thereby to obtain the heat dissipation characteristics of the spark plugs. The temperature changes of the high-voltage central electrodes and the surrounding ceramic insulators of the spark plugs with different heat ratings can be measured under the same spark gap energy conditions, thereby, are used to determine the heat ratings of the spark plugs with different ceramic structures. The present invention does not rely on any engine tests, thus, simplifies the measurement system, with less test parameters to be precisely controlled and shorter experimental durations, thereby, requires lower test costs and has higher efficiency.

DESCRIPTION OF THE EMBODIMENTS

The present invention will now be described by embodiments, with reference to the attached drawings FIGS. 1 to 6. The embodiment 1 is the best application of the present invention.

Embodiment 1

Figure 1:
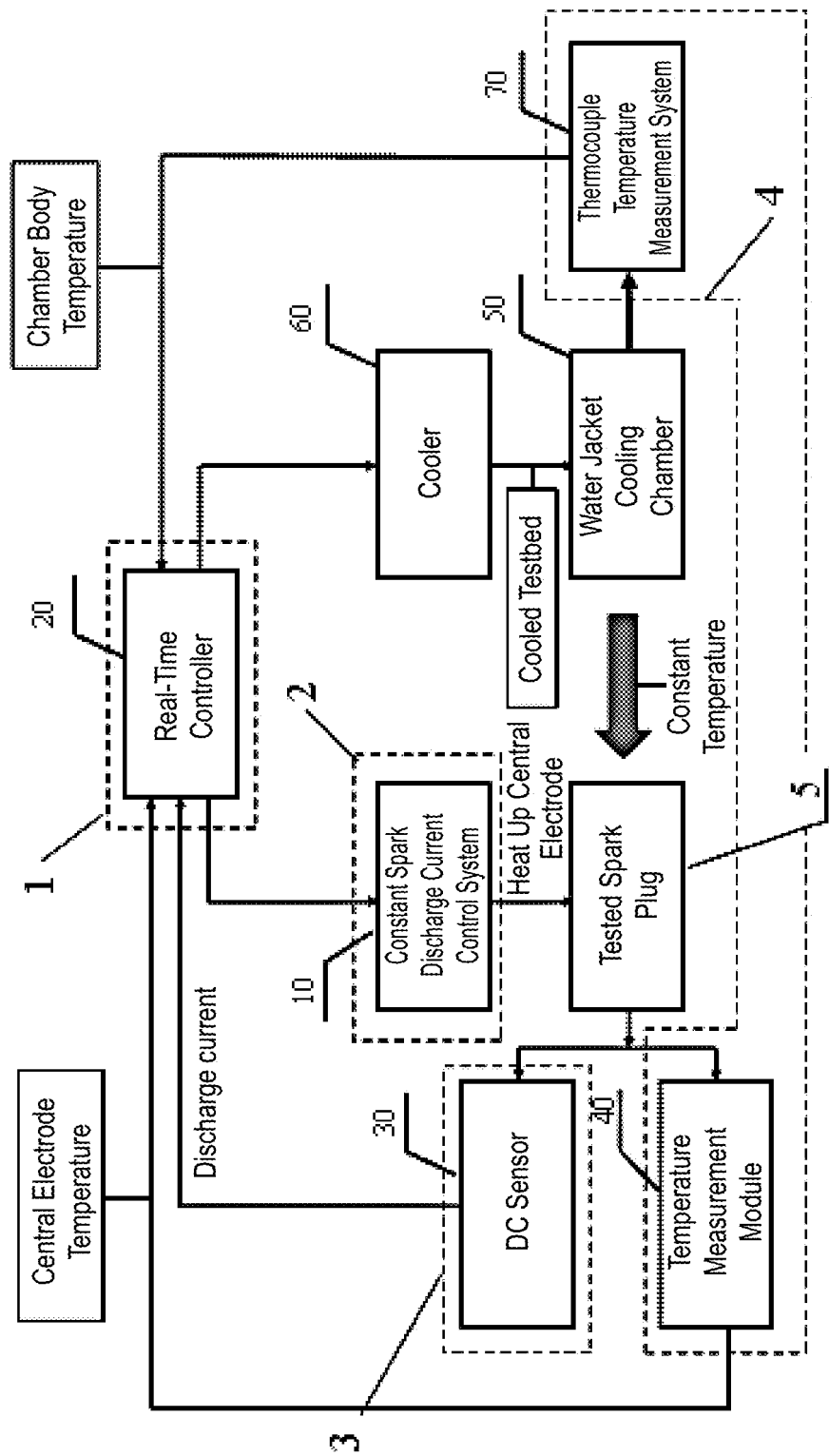
FIG. 1 illustrates the control circuit of the measurement system in accordance with the present invention.
Figure 2:
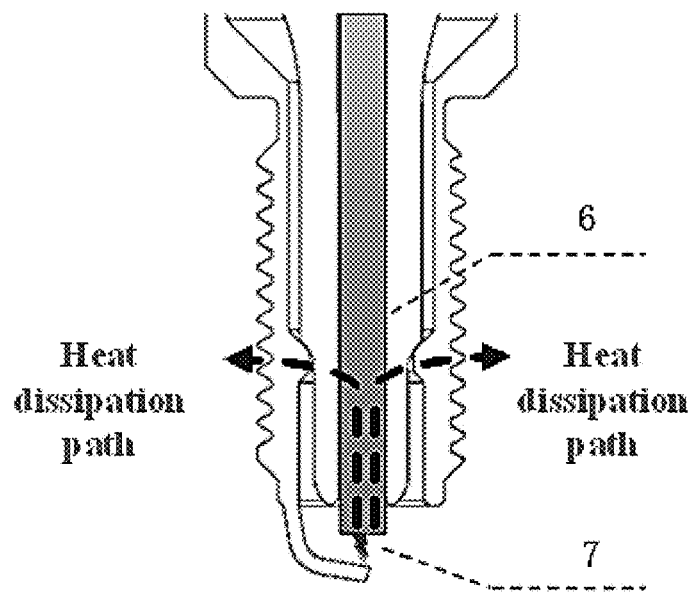
FIG. 2 is the heat dissipation paths of a spark plug during the heating process.
Figure 3:
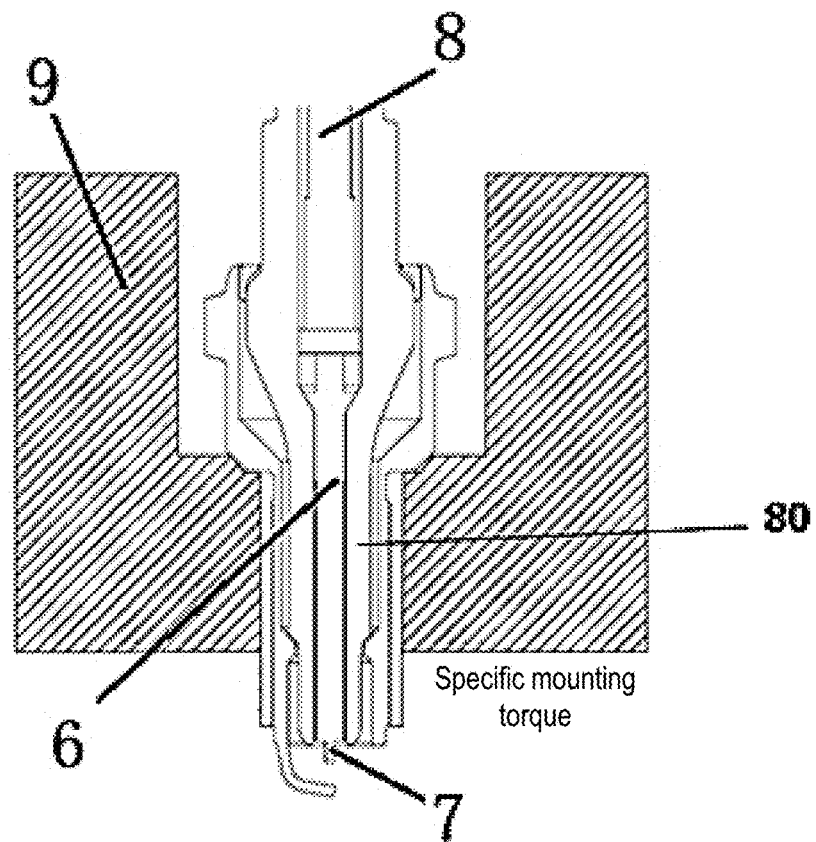
FIG. 3 is the assembly diagram of the spark plug in the constant-temperature water jacket cooling chamber.
Figure 4:
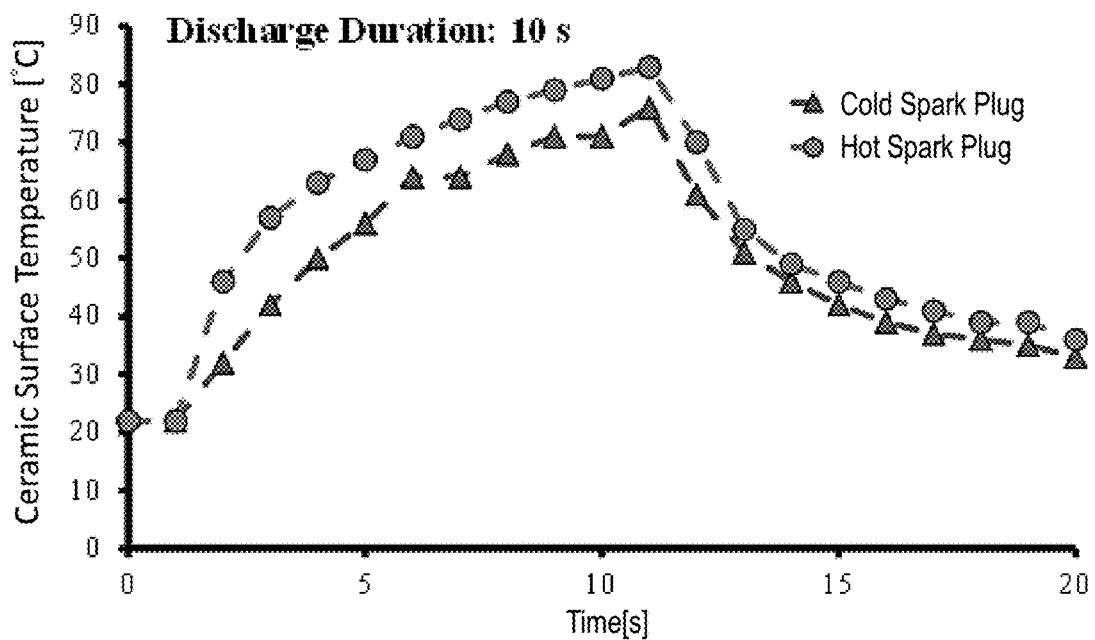
FIG. 4 illustrates the comparison of the ceramic insulator temperature curves for spark plugs with two heat ratings in embodiment 1.

Referring now to FIGS. 1 to 3, the present invention relates to a spark plug heat rating measurement system based on spark discharge current active heating, which includes the constant spark discharge current control module 2, the real-time control module 1, the spark discharge current measurement module 3, the temperature detection module 4, and the tested spark plug 5. The constant spark discharge current control module 2 is connected to the high-voltage terminal 8 of the tested spark plug 5. The constant spark discharge current control module 2 provides controllable spark discharge current to heat up the high-voltage central electrode 6 of the tested spark plug 5; the spark discharge current measurement module 3 is connected to both the tested spark plug 5 and the real-time control module 1, thereby to instantaneously measure the spark discharge current amplitude and feedback the measurement results to the real-time control module 1; the temperature detection module 4 is also connected to both the tested spark plug 5 and the real-time control module 1. The temperature detection module 4 is used to real time monitor the temperatures of the high-voltage central electrode 6 and the surrounding ceramic insulator 80 of the tested spark plug 5, and feedback the temperature signals to the real-time control module 1. The real-time control module 1 is used to dynamically monitor and control the output discharge current level of the constant spark discharge current control module 2. The tested spark plug 5 is installed in the constant-temperature water jacket cooling chamber 50 through a torque of 30 Nm. The constant-temperature water jacket cooling chamber 50 is cooled by the cooler 60. The temperature of the chamber body of the constant-temperature water jacket cooling chamber 50 is controlled within 0° C.-80° C. by the real-time control module 1. The real-time control module 1 consists of the real-time controller 20 and its control circuit. The real-time control module 1 is used to monitor the spark discharge current level and dynamically control the output discharge current level of the constant spark discharge current control module 2.

The temperature detection module 4 includes a temperature measurement module 40 for the high-voltage central electrode 6 and the surrounding ceramic insulator 80 of the tested spark plug 5, and a thermocouple temperature measurement system 70 for the constant-temperature water jacket cooling chamber 50; the temperature measurement module 40 is mainly used to measure the temperature changes of the high-voltage central electrode 6 and the surrounding ceramic insulator 80 of the tested spark plug 5 during the discharge process, and provide the measurement results to the real-time controller 20. The temperature curves of the high-voltage central electrode 6 and the surrounding ceramic insulator 80 measured during the discharge process are used as the parameters to evaluate the heat rating of the tested spark plug 5. The tested spark plug 5 is installed in the constant-temperature water jacket cooling chamber 50 through a torque of 30 Nm. The thermocouple temperature measurement system 70 is used to measure the temperature of the constant-temperature water jacket cooling chamber 50, and feedback the temperature to the real-time controller 20. The real-time controller 20 controls the cooler 60, to ensure the temperature of the constant-temperature water jacket cooling chamber 50 is within 0-80° C.

The spark discharge current measurement module 3 is a DC sensor 30. The DC sensor 30 is used to measure the spark discharge current amplitude. The temperature measurement module 40 for the high-voltage central electrode 6 and the surrounding ceramic insulator 80 includes an infrared temperature measurement system, a thermocouple measurement system, and a laser-induced fluorescence detection system.

The constant spark discharge current control module 2 consists of a constant spark discharge current control system 10 and its control circuit. The constant spark discharge current control system 10 is connected to the high-voltage terminal 8 of the tested spark plug 5 and the real-time controller 20 respectively. The constant spark discharge current control module 2 provides real-time controlled spark discharge current to the tested spark plug 5 to heat up the high-voltage central electrode 6.

The spark discharge current measurement module 3 consists of a DC sensor 30 and its control circuit. The DC sensor 30 is connected to the real-time controller 20 and placed beside the tested spark plug 5. The DC sensor 30 is used to measure the spark discharge current amplitude and feedback the measurement results to the real-time controller 20.

The temperature detection module 4 includes the temperature measurement module 40 for the high-voltage central electrode 6 and the surrounding ceramic insulator 80 of the tested spark plug 5, and the thermocouple temperature measurement system 70 for the constant-temperature water jacket cooling chamber 50. The temperature measurement module 40 is placed beside the tested spark plug 5, and also connected to the real-time controller 20. The temperature measurement module 40 is used to real time measure the temperatures of the high-voltage central electrode 6 and the surrounding ceramic insulator 80, and feedback the temperature to the real-time controller 20. The thermocouple temperature measurement system 70 is placed inside the constant-temperature water jacket cooling chamber 50, to real time measure the temperature of the chamber body of the constant-temperature water jacket cooling chamber 50 and feedback the chamber body temperature to the real-time controller 20.

FIG. 2 is the heat dissipation path of a spark plug when the high-voltage central electrode 6 is heated during the spark plug heat rating measurement process. The heat ratings of spark plugs with different ceramic insulator structures are determined by the temperature profiles of the high-voltage central electrodes and the surrounding ceramic insulators of the spark plugs. The spark plugs with different heat ratings are installed in the spark plug heat rating measurement system 9 through a torque of 30 Nm. FIG. 3 is the installation diagram of a spark plug in the constant-temperature water jacket chamber. In the instant embodiment 1, the temperature profiles of the high-voltage central electrodes and the surrounding ceramic insulators of spark plugs with different ceramic insulator structures are measured under the same spark gap energy conditions, with real time controlling of the spark discharge current amplitude. The temperature changes of the high-voltage central electrodes and the surrounding ceramic insulators of the spark plugs are used to determine the heat ratings of the spark plugs.

The claimed precise control of the spark discharge current in the instant embodiment 1 is to install the tested spark plug 5 in the constant-temperature water jacket cooling chamber 50 with a torque of 30 Nm, and connect the high-voltage terminal 8 of the tested spark plug 5 to the constant spark discharge current control module 2. The constant spark discharge current control module 2 provides real-time controlled discharge current to the tested spark plug 5 to heat the high-voltage central electrode 6. During the discharge process, the discharge current amplitude of the constant spark discharge current control module 2 is adjusted by the real-time control module 1, based on both the spark discharge current amplitude measured by the DC sensor 30, and the temperatures of the high-voltage central electrode 6 and the surrounding ceramic insulator 80 in the vicinity of the spark plasma channel 7 provided by the temperature measurement module 40. By doing this, the constant spark discharge current control module 2 provides the needed spark gap energy to heat the high-voltage central electrode 6 of the tested spark plug 5.

The claimed method of measuring the temperature changes of the high-voltage central electrodes and the surrounding ceramic insulators of spark plugs with different ceramic insulator structures in the instant embodiment 1 is to install different spark plugs in the temperature detection module 4 with a torque of 30 Nm. The heat ratings of the spark plugs are evaluated by the temperature changes of the high-voltage central electrodes and the surrounding ceramic insulators measured under the same spark gap energy condition, thereby to indicate the heat dissipation characteristics of the ceramic insulators of the spark plugs. The claimed method of using the temperature changes of different spark plugs under the same spark gap energy condition to evaluate the heat ratings of spark plugs in the instant embodiment 1 is to supply the same amount of spark gap energy to the spark plugs, thereby to heat up the high-voltage central electrodes and the surrounding ceramic insulators (as shown in FIG. 1) by actively controlling the spark discharge current amplitude. By precisely controlling the discharge duration from 10 s to 120 s and the discharge current amplitude from 40 mA to 200 mA, the supplied spark gap energy of different spark plugs can be controlled to the same level. With the same spark gap energy, the temperature profiles of the high-voltage central electrodes and the surrounding ceramic insulators are measured by the temperature measurement module 40 to evaluate the heat ratings of different spark plugs.

EMBODIMENTS OF THE INVENTION

Apart from embodiment 1, the present invention can be applied in other embodiments.

Embodiment 2

The instant embodiment 2 has the same measurement principle as the embodiment 1, but uses different measurement methods. In the instant embodiment 2, the spark plug heat rating measurement system based on spark discharge current active heating includes the constant spark discharge current control module 2, the real-time control module 1, the spark discharge current measurement module 3, the temperature detection module 4, and the tested spark plug 5. The tested spark plug 5 is installed in the constant-temperature water jacket cooling chamber 50. The constant-temperature water jacket cooling chamber 50 is cooled by the cooler 60, and the temperature of the constant-temperature water jacket cooling chamber 50 is controlled by the real-time control module 1 to be constant at 0° C. or 80° C., wherein the real-time control module 1 consists of the real-time controller 20 and its control circuit. The real-time control module 1 is used to monitor the spark discharge current level and real time control the output current from the constant spark discharge current control module 2.

In the instant embodiment 2, the constant spark discharge current control module 2 consists of the constant spark discharge current control system 10 and its control circuit. The constant spark discharge current control system 10 is connected to the high-voltage terminal 8 of the tested spark plug 5 and the real-time controller 20 respectively. The constant spark discharge current control module 2 provides dynamically controlled spark discharge current to the tested spark plug 5 to heat up the high-voltage central electrode 6.

In the instant embodiment 2, the spark discharge current measurement module 3 consists of the DC sensor 30 and its control circuit. The DC sensor 30 is arranged beside the tested spark plug 5, being connected to the real-time controller 20. The DC sensor 30 measures the spark discharge current amplitude and feedback the measurement results to the real-time controller 20.

In the instant embodiment 2, the temperature detection module 4 includes the temperature measurement module 40 for the high-voltage central electrode 6 and the surrounding ceramic insulator 80 of the tested spark plug 5, and the thermocouple temperature measurement system 70 for the constant-temperature water jacket cooling chamber 50. The temperature measurement module 40 is placed beside the tested spark plug 5, with the connection to the real-time controller 20, thereby to measure the temperatures of the high-voltage central electrode 6 and the surrounding ceramic insulator 80 of the tested spark plug 5, and feedback the temperatures to the real-time controller 20. The thermocouple temperature measurement system 70 is arranged inside the constant-temperature water jacket cooling chamber 50, to real time measure the chamber body temperature and feedback the results to the real-time controller 20.

During the spark plug heat rating measurement process, the heat ratings of spark plugs with different ceramic insulator structures are evaluated by the temperature changes of the high-voltage central electrodes and the surrounding ceramic insulators of the spark plugs. Different spark plugs are installed in the spark plug heat rating measurement system 9 with spark discharge current active heating through a torque of 30 Nm. The claimed method of measuring the heat ratings of the spark plugs through the temperate changes of the high-voltage central electrodes and the surrounding ceramic insulators is to measure the temperature changes of the high-voltage central electrodes and the surrounding ceramic insulators under the same spark gap energy condition, through real time controlling of the spark discharge current amplitude.

The claimed method of measuring the heat ratings of the spark plugs through the temperate changes of the high-voltage central electrodes and the surrounding ceramic insulators is to calculate the instantaneous heating powers of the spark plugs by measuring the discharge voltages at the high-voltage terminals of the spark plugs and the discharge current. The constant spark discharge current control system 10 is used to real time adjust the discharge current levels to make sure the heating powers of different spark plugs during the heating process are the same. With different heating durations, the high-voltage central electrodes and the surrounding ceramic insulators of different spark plugs can reach the same temperature. The heat ratings of the spark plugs can be evaluated by measuring the temperature rising curves of the high-voltage central electrodes and the surrounding ceramic insulators during the heating process.

Embodiment 3

The instant embodiment 3 has the same measurement principle as embodiment 1 and embodiment 2, but uses different measurement methods. In the instant embodiment 3, the spark plug heat rating measurement system based on spark discharge current active heating includes the constant spark discharge current control module 2, the real-time control module 1, the spark discharge current measurement module 3, the temperature measurement module 4, and the tested spark plug 5. The tested spark plug 5 is installed in the constant-temperature water jacket cooling chamber 50. The constant-temperature water jacket cooling chamber 50 is cooled by the cooler 60. The temperature of the chamber 50 is controlled by the real-time control module 1 to be constant at 0° C. or 80° C., wherein the real-time control module 1 consists of the real-time controller 20 and its control circuit. The real-time control module 1 is used to monitor the spark discharge current amplitude and real time control the output discharge current from the constant spark discharge current control module 2.

In the instant embodiment 3, the constant spark discharge current control module 2 consists of the constant spark discharge current control system 10 and its control circuit. The constant spark discharge current control system 10 is connected to the high-voltage terminal 8 of the tested spark plug 5 and the real-time controller 20 respectively. The constant spark discharge current control module 2 provides dynamically controlled spark discharge current to the tested spark plug 5 to heat up the high-voltage central electrode 6.

In the instant embodiment 3, the spark discharge current measurement module 3 consists of the DC sensor 30 and its control circuit. The DC sensor 30 is arranged beside the tested spark plug 5, with the connection to the real-time controller 20. The DC sensor 30 measures the spark discharge current amplitude and feedback the measurement results to the real-time controller 20.

In the instant embodiment 3, the temperature detection module 4 includes the temperature measurement module 40 for the high-voltage central electrode 6 and the surrounding ceramic insulator 80 of the tested spark plug 5, and the thermocouple temperature measurement system 70 for the constant-temperature water jacket cooling chamber 50. The temperature measurement module 40 is placed beside the tested spark plug 5, with the connection to the real-time controller 20, thereby to measure the temperatures of the high-voltage central electrode 6 and the surrounding ceramic insulator 80 of the tested spark plug 5, and feedback the temperatures to the real-time controller 20. The thermocouple temperature measurement system 70 is arranged inside the constant-temperature water jacket cooling chamber 50, to real time measure the chamber body temperature and feedback the results to the real-time controller 20.

During the spark plug heat rating measurement process, the heat ratings of spark plugs with different ceramic insulator structures are evaluated by the temperature changes of the high-voltage central electrodes and the surrounding ceramic insulators of the spark plugs. Different spark plugs are installed in the spark plug heat rating measurement system 9 with spark discharge current active heating through a torque of 30 Nm. The claimed method of measuring the heat ratings of the spark plugs through the temperate changes of the high-voltage central electrodes and the surrounding ceramic insulators is to measure the temperature changes of the high-voltage central electrodes and the surrounding ceramic insulators under the same spark gap energy condition, through real time controlling of the spark discharge current amplitude.

Figure 5:
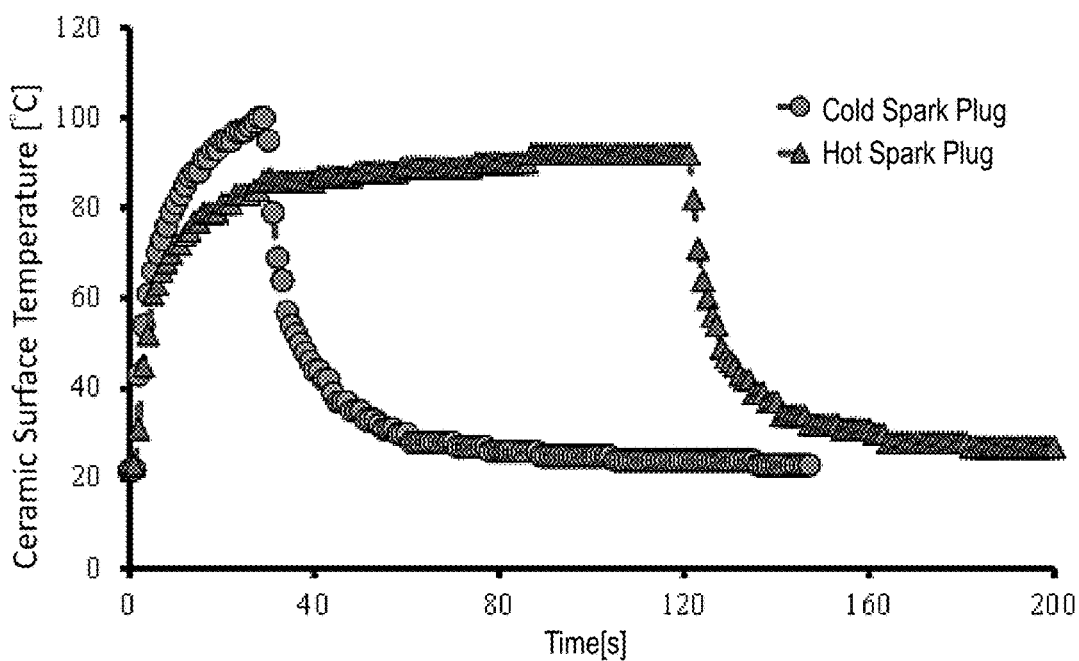
FIG. 5 illustrates the comparison of the ceramic insulator temperature curves for spark plugs with two heat ratings in embodiment 2.
Figure 6:
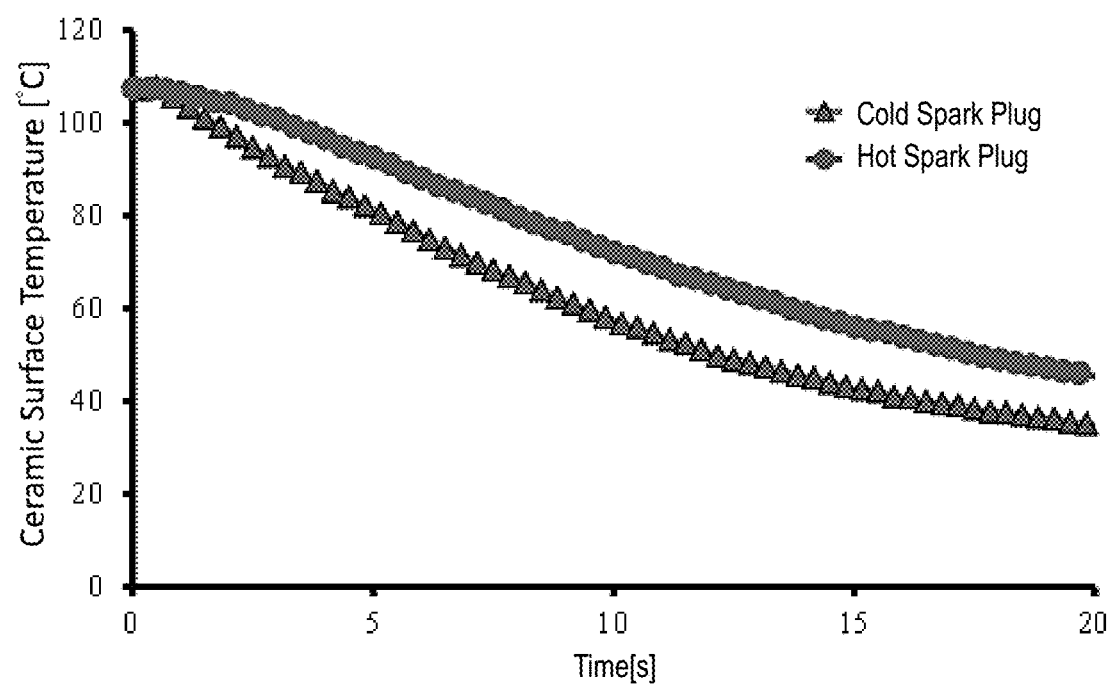
FIG. 6 illustrates the comparison of the ceramic insulator temperature curves for spark plugs with two heat ratings during the cooling process in embodiment 3.

The claimed method of measuring the heat ratings of the spark plugs through the temperate changes of the high-voltage central electrodes and the surrounding ceramic insulators is to heat the high-voltage central electrodes and the surrounding ceramic insulators of the spark plugs by the real-time controlled spark discharge current. The high-voltage central electrodes and the surrounding ceramic insulators of different spark plugs can be heated to the same temperature through different heating powers or heating durations. Once the temperatures reach the same level, the heating process is cut off, letting the spark plugs cool down naturally. The temperature profiles during the cooling process are recorded, as shown in FIG. 5 and FIG. 6. Since the heat ratings of the spark plugs represent the heat dissipation capability of the high-voltage central electrodes and the surrounding ceramic insulators, the spark plugs with different heat ratings will have different temperature curves during the cooling process. Therefore, the temperature curves of the cooling process can be used as the parameters to evaluate the heat ratings of different spark plugs.

The foregoing description of methods and embodiments of the invention has been presented for purposes of illustration. It is not intended to be exhaustive or to limit the invention to the precise steps and/or forms disclosed, and obviously many modifications and variations are possible in light of the above teaching. The use of "above," "below," "front," "back," or "middle" and variations thereof herein is for the purpose of description and should not be regarded as limiting. The structure, ratio, and size shown in the attached drawings are used to help understanding of the present invention and should not be regarded as limiting. It is intended that the scope of the invention and all equivalents be defined by the claims appended hereto. The specific value of torque for the spark plug mounting is not meant to fix the mounting torque, but to emphasis same torque should be used among various spark plugs to guarantee reliable heat transfer path from spark plug to mounting block. Inconsistency in mounting torque for different spark plugs will affect the heat rating measurement.

Industry Application Value

The present invention uses a special-designed spark discharge current active control circuit to realize a long and stable spark discharge process, with real time and precise adjustment of the discharge current. The present invention uses the spark discharge current to heat up the high-voltage central electrode from the inside of the spark plug. With the precise control of the spark gap energy, the temperature changes of the high-voltage central electrodes and the surrounding ceramic insulators of different spark plugs are used to evaluate the heat ratings of the spark plugs. As compared with the conventional spark plug heat rating measurement method which utilizes a specific engine to heat spark plug for measuring the heat rating of spark plug, the spark plug heat rating measurement method disclosed in present invention requires much simpler experimental facilities, with shorter experimental time, and higher experimental repeatability and controllability. The present invention does not rely on any engine tests, thus, simplifies the measurement system, with less test parameters to be precisely controlled and shorter experimental durations, thereby, requires lower test costs and has higher efficiency.

What is claimed is:

1. A spark plug heat rating measurement method based on spark discharge current active heating, wherein: during a spark discharge process, a spark discharge current is precisely adjusted to control temperature of a spark plasma channel for heating up a high-voltage central electrode of the spark plug, and temperature changes of the high-voltage central electrode and a surrounding ceramic insulator of the spark plug are measured to evaluate a heat rating of the spark plug;

wherein: the temperature changes of high-voltage central electrodes and surrounding ceramic insulators of different spark plugs with different heat ratings are measured by placing the spark plugs in a temperature detection module which includes the temperature measurement module; with a same amount of spark gap energy supplied to the spark plugs, the temperature changes of the ceramic insulators are measured to evaluate the heat ratings of the spark plugs and heat dissipation characteristics of the ceramic insulators.

2. The spark plug heat rating measurement method of claim 1, wherein: the spark plug is installed in a constant-temperature water jacket cooling chamber, and a constant spark discharge current control module is connected to a high-voltage terminal of the spark plug; the constant spark discharge current control module provides the constant controllable spark discharge current to the spark plug to heat up the high-voltage central electrode through the high temperature of the spark plasma channel; during the discharge process, a real-time controller dynamically adjusts the spark discharge current of the constant spark discharge current control module, based on a discharge current amplitude provided by a DC sensor, and the temperatures of the high-voltage central electrode and the surrounding ceramic insulator measured by a temperature measurement module, to control the temperature of the spark plasma channel and provide a required spark energy to heat up the central electrode of the spark plug.

3. The spark plug heat rating measurement method of claim 1, wherein: the same amount of spark gap energy is supplied to the spark plugs with different heat ratings through a real time control of the spark discharge current, to heat up the high-voltage central electrodes and the ceramic insulators of the spark plugs; in order to precisely control the spark gap energy, a discharge duration is controlled between 10 s and 20 s, and a discharge current amplitude is controlled between 40 mA and 200 mA; by doing this, the temperature profiles of the high-voltage central electrodes and the surrounding ceramic insulators of the spark plugs are measured to compare the heat ratings of spark plugs with the different ceramic insulators.

4. The spark plug heat rating measurement method of claim 1, wherein: the spark discharge current is dynamically adjusted to control the temperatures of spark plasma channels of the spark plugs; the spark plasma channels are used to heat up the high-voltage electrodes of the spark plugs with different heat ratings; in the meantime, the discharge voltages at the spark plug terminals of the spark plugs and the spark discharge current are measured to calculate the heating powers of the spark plugs; with the constant spark discharge current control module, spark discharge current levels is adjusted in real time to ensure the instantaneous heating powers of the different spark plugs are the same during the heating process; with different heating durations, the high voltage electrodes and the surrounding ceramic insulators of the different spark plugs can be heated to the same temperature; the temperature changes of the high-voltage central electrodes and the surrounding ceramic insulators during the heating process are measured to evaluate the heat ratings of the spark plugs.

5. The spark plug heat rating measurement method of claim 1, wherein: with dynamically controlled the spark discharge current, using different heating powers or heating durations, spark plasma channels with different temperatures are generated to heat up the high-voltage central electrodes and the surrounding ceramic insulators of the spark plugs with different heat ratings to the same temperature; once the temperatures of the high-voltage central electrodes and the surrounding ceramic insulators of the different spark plugs reach the same temperature, the heating process is cut off, letting the spark plugs be cooled down naturally; during the spark plug cooling processes of the spark plugs, the temperature profiles of the high-voltage central electrodes and the surrounding ceramic insulators are recorded; since the heat rating of the spark plug reflects a heat dissipation capability of the high-voltage central electrode and the surrounding ceramic insulator, the spark plugs with different heat ratings will have different temperature profiles during the cooling process; the temperature profiles of the cooling process can be used to evaluate the heat ratings of the spark plug.

6. A spark plug heat rating measurement system based on discharge current active heating, wherein: the system comprises a constant spark discharge current control module, a real-time module, a spark discharge current measurement module, a temperature detection module, and the tested spark plug; the constant spark discharge current control module is connected to a high-voltage terminal of the tested spark plug; the constant spark discharge current control module provides a real time-controlled spark discharge current to heat up a high-voltage central electrode of the tested spark plug; the spark discharge current measurement module is connected to both the tested spark plug and the real-time module; the spark discharge current measurement module is used to real time measure a spark discharge current amplitude and provides measurement results to the real-time controller; the temperature detection module is connected to both the tested spark plug and the real-time module; the temperature detection module is used to monitor temperatures of the high-voltage central electrode and the surrounding ceramic insulator of the tested spark plug, and feedback temperature signals to the real-time module; the real-time module dynamically monitors and controls output discharge current level of the constant spark discharge current control module;

wherein: the temperature measurement module includes the temperature measurement module, and a thermocouple temperature measurement system; the temperature measurement module is mainly used to measure the temperature changes of the high-voltage central electrode and the surrounding ceramic insulator of the tested spark plug during a discharge process, and provides a temperature information to a real-time controller consisted of the real-time module; the temperature profiles of the high-voltage central electrode and the surrounding ceramic insulator measured during the discharge process are used as parameters to evaluate the heat rating of the tested spark plug; the tested spark plug is installed in a constant temperature water jacket cooling chamber; the thermocouple temperature measurement system is used to measure the temperature of the constant-temperature water jacket chamber, and feedback to the real-time controller; the real-time controller controls a cooler, to ensure the temperature of the constant temperature water jacket cooling chamber is within 0-80° C.

7. The spark plug heat rating measurement system of claim 6, wherein: the spark discharge current measurement module is a DC sensor, to real time measure the spark discharge current amplitude; the temperature measurement module includes an infrared temperature measurement system, a thermocouple measurement system, and a laser-induced fluorescence detection system.

\* \* \* \* \*